(12) United States Patent
Ohara

(10) Patent No.: US 12,062,627 B2
(45) Date of Patent: Aug. 13, 2024

(54) SEMICONDUCTOR DEVICE

(71) Applicant: RENESAS ELECTRONICS CORPORATION, Tokyo (JP)

(72) Inventor: Yoshihiro Ohara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 311 days.

(21) Appl. No.: 17/467,964

(22) Filed: Sep. 7, 2021

(65) Prior Publication Data

US 2022/0084960 A1 Mar. 17, 2022

(30) Foreign Application Priority Data

Sep. 11, 2020 (JP) .................................. 2020-152505

(51) Int. Cl.
| | |
|---|---|
| *H01L 21/00* | (2006.01) |
| *H01L 23/48* | (2006.01) |
| *H01L 23/528* | (2006.01) |
| *H01L 23/60* | (2006.01) |
| *H01L 25/065* | (2023.01) |

(52) U.S. Cl.
CPC ............ *H01L 23/60* (2013.01); *H01L 23/481* (2013.01); *H01L 23/5286* (2013.01); *H01L 25/0652* (2013.01); *H01L 2225/06513* (2013.01); *H01L 2225/06544* (2013.01); *H01L 2225/06586* (2013.01)

(58) Field of Classification Search
CPC .... H01L 23/60; H01L 23/481; H01L 23/5286
See application file for complete search history.

(56) References Cited

U.S. PATENT DOCUMENTS

| | | | | |
|---|---|---|---|---|
| 8,174,124 B2 * | 5/2012 | Chiu | ................... | H01L 21/6835 |
| | | | | 257/E23.101 |
| 11,437,708 B2 * | 9/2022 | Huang | ..................... | H01L 25/50 |
| 2007/0134819 A1 * | 6/2007 | Uchiyama | ............. | H01L 23/481 |
| | | | | 257/E21.597 |
| 2010/0171226 A1 * | 7/2010 | West | ..................... | H01L 23/481 |
| | | | | 257/774 |
| 2011/0248404 A1 * | 10/2011 | Chiu | ................... | H01L 21/6835 |
| | | | | 257/773 |
| 2013/0313690 A1 * | 11/2013 | Miyazaki | .......... | H01L 21/76898 |
| | | | | 257/621 |
| 2021/0305678 A1 * | 9/2021 | Huang | ...................... | H01P 1/15 |
| 2022/0084960 A1 * | 3/2022 | Ohara | ................ | H01L 25/0652 |
| 2022/0368004 A1 * | 11/2022 | Huang | ................ | H01L 27/0251 |

FOREIGN PATENT DOCUMENTS

| | | | | | |
|---|---|---|---|---|---|
| CN | 114171454 A | * | 3/2022 | ....... | H01L 21/76898 |
| EP | 3968370 A1 | * | 3/2022 | ....... | H01L 21/76898 |
| JP | 2013-247273 A | | 12/2013 | | |
| JP | 2022046884 A | * | 3/2022 | ....... | H01L 21/76898 |

OTHER PUBLICATIONS

Extended European Search Report issued in corresponding European Patent Application No. 21195400.3-1211, dated Feb. 10, 2022.
Y. Fukumoto et al., "Development of Plasma Charge-up Damage Evaluation Wafers", R&D Kobe Steel Engineering Reports, vol. 52, No. 2, Sep. 2002.
Notice of Reasons for Refusal received in Japanese Patent Application No. 2020-152505, mailed Oct. 24, 2023.

* cited by examiner

*Primary Examiner* — Laura M Menz
(74) *Attorney, Agent, or Firm* — Rimon P.C.

(57) ABSTRACT

A part among a plurality of through vias formed in a non-transistor region is a floating via having a floating potential.

11 Claims, 14 Drawing Sheets

SEMICONDUCTOR DEVICE

CROSS-REFERENCE TO RELATED APPLICATIONS

The present application claims priority from Japanese Patent Application No. 2020-152505 filed on Sep. 11, 2020, the content of which is hereby incorporated by reference to this application.

BACKGROUND

The present invention relates to a semiconductor device, for example, a technique effectively applicable to a semiconductor device having a through via(s).

Non-Patent Document 1 (Kobe Steel Technical Report/ Vol. 52, No 2 (September 2002)) discloses a technique related to plasma charge-up.

SUMMARY

Semiconductor devices for artificial intelligence and data centers mount neural networks such as large-scale product-sum arithmetic circuits, and are required to process a large amount of data in real time. That is, in the semiconductor devices for artificial intelligence and data centers, mounting broadband, large-capacity memory devices and making power consumption low are demanded from necessity for saving and updating a large amount of image data and for saving and updating weight data of a large-capacity neural network at high speed. For this reason, a semiconductor device in which semiconductor chips such as broadband memories are three-dimensionally laminated via a through via(s) is being examined.

However, when the through via for laminating the semiconductor chips is formed on the semiconductor chips, destruction of the through via due to plasma charge-up has become apparent as a problem. Occurrence of such destruction of the through via brings defectiveness of the semiconductor chips, which leads to a decrease in reliability of the semiconductor device and a decrease in manufacturing yield thereof. Therefore, in order to improve the reliability and the manufacturing yield of the semiconductor device, it is desired to suppress the destruction of the through via due to the plasma charge-up.

In one embodiment, some of a plurality of through vias formed in a non-transistor region are through vias having a floating potential.

According to one embodiment, the reliability of the semiconductor device can be improved.

DETAILED DESCRIPTION

Figure 1:
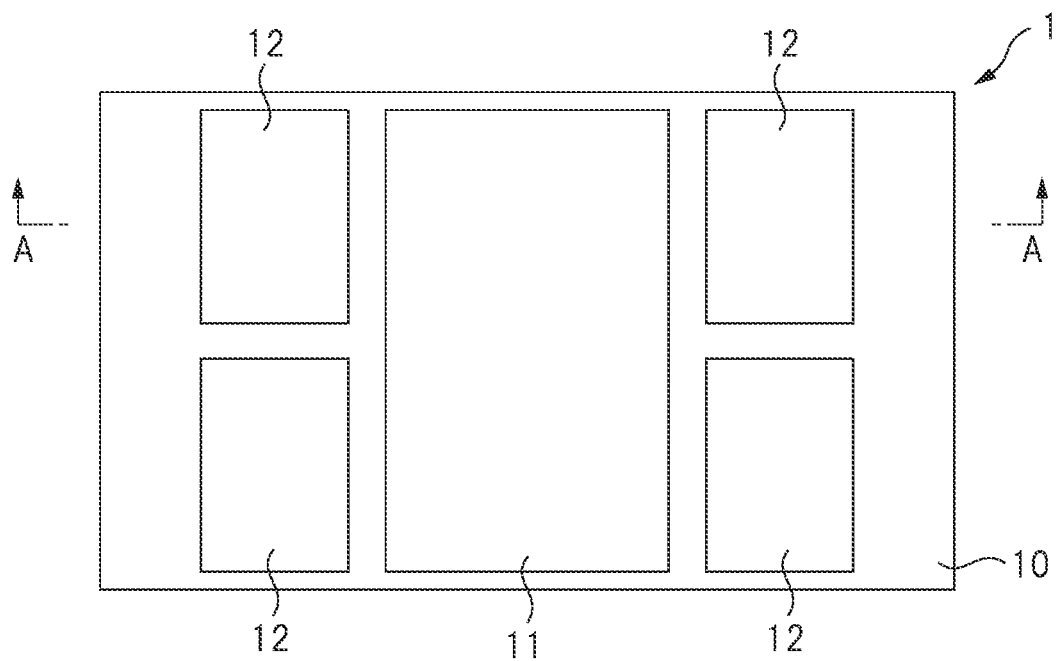
FIG. 1 is a plan view showing a schematic configuration of a semiconductor device.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Components having the same function are denoted by the same reference characters throughout the drawings for describing the embodiments, and the repetitive description thereof will be omitted. Incidentally, in the drawings used in the following embodiments, hatching is used even in a plan view so as to make the drawings easy to see.

(Configuration of Semiconductor Device)

A technical idea in this embodiment is applied to, for example, a semiconductor device that mounts a central processing unit (CPU) composed of a logic IC and also mounts a wideband, large-capacity memory device similarly to a semiconductor device for artificial intelligence or a data center.

FIG. 1 is a plan view showing a schematic configuration of a semiconductor device.

In FIG. 1, a semiconductor device 1 has, for example, a wiring substrate 10 having a rectangular shape. Mounted on the wiring substrate 10 are: a semiconductor chip 11 in which a central processing unit composed of logic ICs is formed; and a laminated chip structure 12 in which a plurality of memory chips are three-dimensionally laminated. This semiconductor device 1 will be put into practical use as a high-performance memory product for next-generation network systems and artificial intelligence/data center accelerators.

Figure 2:
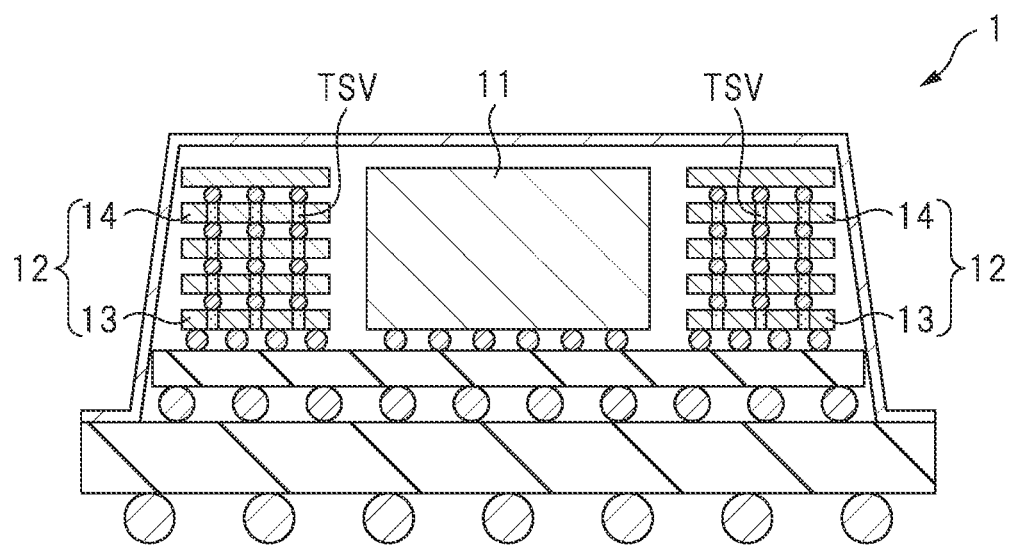
FIG. 2 is a cross-sectional view taken along line A-A of FIG. 1.

FIG. 2 is a cross-sectional view taken along line A-A of FIG. 1.

Focusing on the laminated chip structure 12 in FIG. 2, the laminated chip structure 12 includes: a base chip 13 arranged in the lowermost layer; and a plurality of memory chips 14 laminated and arranged on the base chip 13. Such a semiconductor device 1 has the laminated chip structure 12 in order to realize a large-capacity memory device. Then, respective chips constituting the laminated chip structure 12 are electrically connected via through vias TSV. That is, the through via TSV is formed on each chip of the laminated chip structure 12, and circuits formed on the respective chips are electrically connected via the through vias TSV. Thus, according to the semiconductor device 1, the three-dimensional memory device is realized by the laminated chip structure 12. According to the semiconductor device 1 having such a laminated chip structure 12, obtained is an advantage of being able to mount a large-capacity memory device without increasing a plane size of the semiconductor device 1.

Formed in the base chip 13 arranged on the lowermost layer of the laminated chip structure 12 are: an integrated circuit formed on the base chip 13 itself; a first power supply wiring for supplying a first power supply potential to this integrated circuit; and a second power supply wiring that supplies a second power supply potential to not only a ground wiring for supplying a ground potential but also an integrated circuit formed on the laminated memory chip 14. This is because the base chip 13 is arranged on the lowermost layer of the laminated chip structure 12, so that the second power supply potential is supplied to the memory chip 14 arranged above via the base chip 13. That is, the second power supply wiring formed on the base chip 13 is connected to the through vias TSV formed on the base chip 13, and the second power potential is supplied via the through vias TSV to the integrated circuit formed on the memory chip 14. Further, the through vias TSV are also formed in the memory chip 14, and electrical connection is made between the plurality of memory chips 14 via the through vias TSV. Therefore, the through vias TSV are indispensable for electrically connecting the respective chips constituting the laminated chip structure 12, and improving reliability of the through via TSV is very important from the viewpoint of improving reliability of the semiconductor device 1 including the laminated chip structure 12.

In particular, from the viewpoint of improving the manufacturing yield of the semiconductor device 1, it is important to improve the reliability of the through vias TSV formed in the base chip 13. This is because, in the semiconductor device 1, the laminated chip structure 12 is manufactured by mounting the plurality of memory chips 14 on the base chip 13. Thus, if the manufacturing yield of the base chip 13 is lowered, a plurality of non-defective memory chips 14 mounted on the base chip 13 which is a defective product are also wasted and, as a result, a significant increase in the manufacturing cost is caused.

From this, a technical idea regarding the through via TSV will be described with particular attention to the base chip 13. However, the technical idea in the present embodiment is not limited to the through via TSV formed in the base chip 13, and can be widely applied to, for example, the through via TSV formed on the memory chip 14, either.

(Room for Improvement that affects Reliability of Through Via)

Next, there is room for improvement that affects the reliability of the through via. In particular, by focusing on plasma charge-up that occurs in forming a through hole(s), as a phenomenon that affects the reliability of the through via, by focusing on plasma charge-up that occurs in forming a through hole(s), the room for improvement that becomes apparent in forming the through hole will be described.

Figure 3:
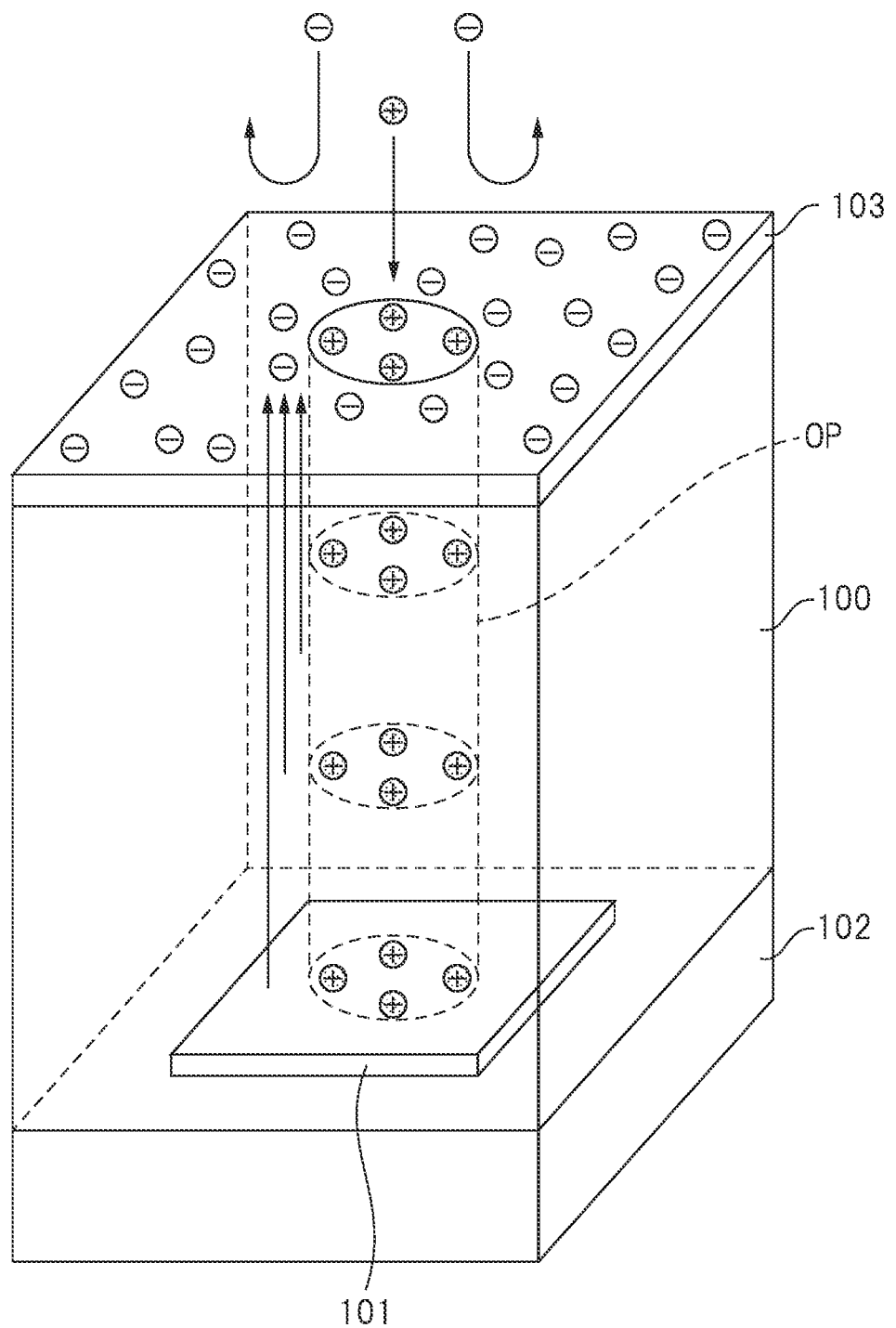
FIG. 3 is a diagram for explaining an example of a mechanism in which destruction of a through via occurs by plasma charge-up generated in forming a through hole.

FIG. 3 is a diagram for explaining an example of a mechanism in which a through via is destroyed by plasma charge-up generated in forming a through hole. Incidentally, in the present specification, a final state in which a conductive material is embedded in a through hole is referred to as a "through via", and it is used separately from the "through hole".

In FIG. 3, for example, formed on a front surface side (lower part of FIG. 3) of a substrate 100 made of silicon are a diffusion layer 101 and a silicon oxide film 102 to be an interlayer insulating layer. Meanwhile, formed on a back surface side (upper part of FIG. 3) of the substrate 100 is a silicon nitride film 103. A through hole OP is formed in such a substrate 100.

This through hole OP is formed by using, for example, photolithography technology and etching technology. Specifically, after applying a resist film on the back surface side of the substrate 100, exposing and developing processings are subjected to the resist film to pattern the resist film. Then, the substrate 100 is etched by using the patterned resist film as a mask. Consequently, the through hole OP is formed in the substrate 100. Thereafter, the patterned resist film is removed. This step of removing the resist film is called an ashing step.

Here, for example, as shown in FIG. 3, when an aspect ratio of the through hole OP is high, electrons are likely to adhere to an upper periphery of the through hole OP due to a difference in spatial momentum between electrons and ions (positive ions) and an inflow of electrons into the through hole OP is hindered. Meanwhile, positive ions and radicals are selectively accumulated on a bottom surface and a side surface of the through hole OP. In particular, in the ashing step of removing the resist film, positive ions and radicals are easily captured on an inner wall of the through hole OP due to reattachment of a product (polymer) to the inner wall, the product being generated by decomposition of the resist film. As a result, an equilibrium state of electrons and ions is disrupted around the through hole OP, and plasma charge-up is induced. This phenomenon is called an "electron shading effect".

Figure 4A:
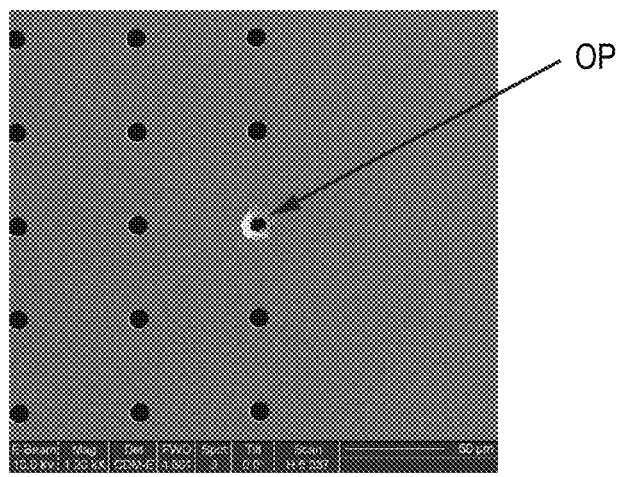
FIGS. 4A and 4B are photographs showing a through hole in which dielectric breakdown has occurred.
Figure 4B:
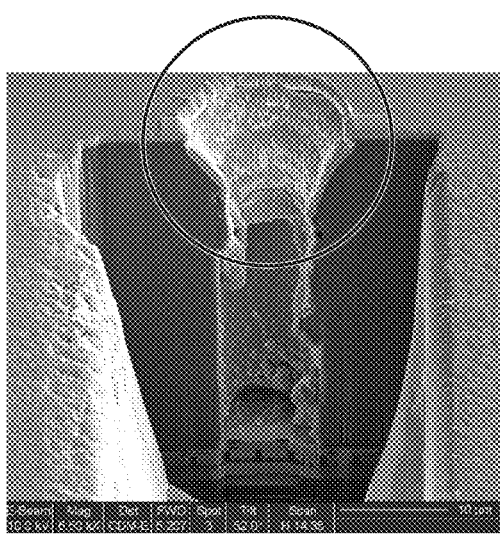

When such an "electron shading effect" occurs, a high electric field (see arrows in FIG. 3) is generated between the positive ions accumulated inside the through hole OP and the electrons adhering to the upper periphery of the through hole OP. Then, dielectric breakdown occurs in the inner wall of the through hole OP due to the high electric field caused by the plasma charge-up. For example, FIGS. 4A and 4B are photographs each showing a through hole in which dielectric breakdown occurs due to plasma charge-up.

Then, when the through via is formed by embedding a conductive material inside the through hole OP in which the dielectric breakdown has been caused, a short-circuit failure occurs at a place where the dielectric breakdown has occurred.

Figure 5:
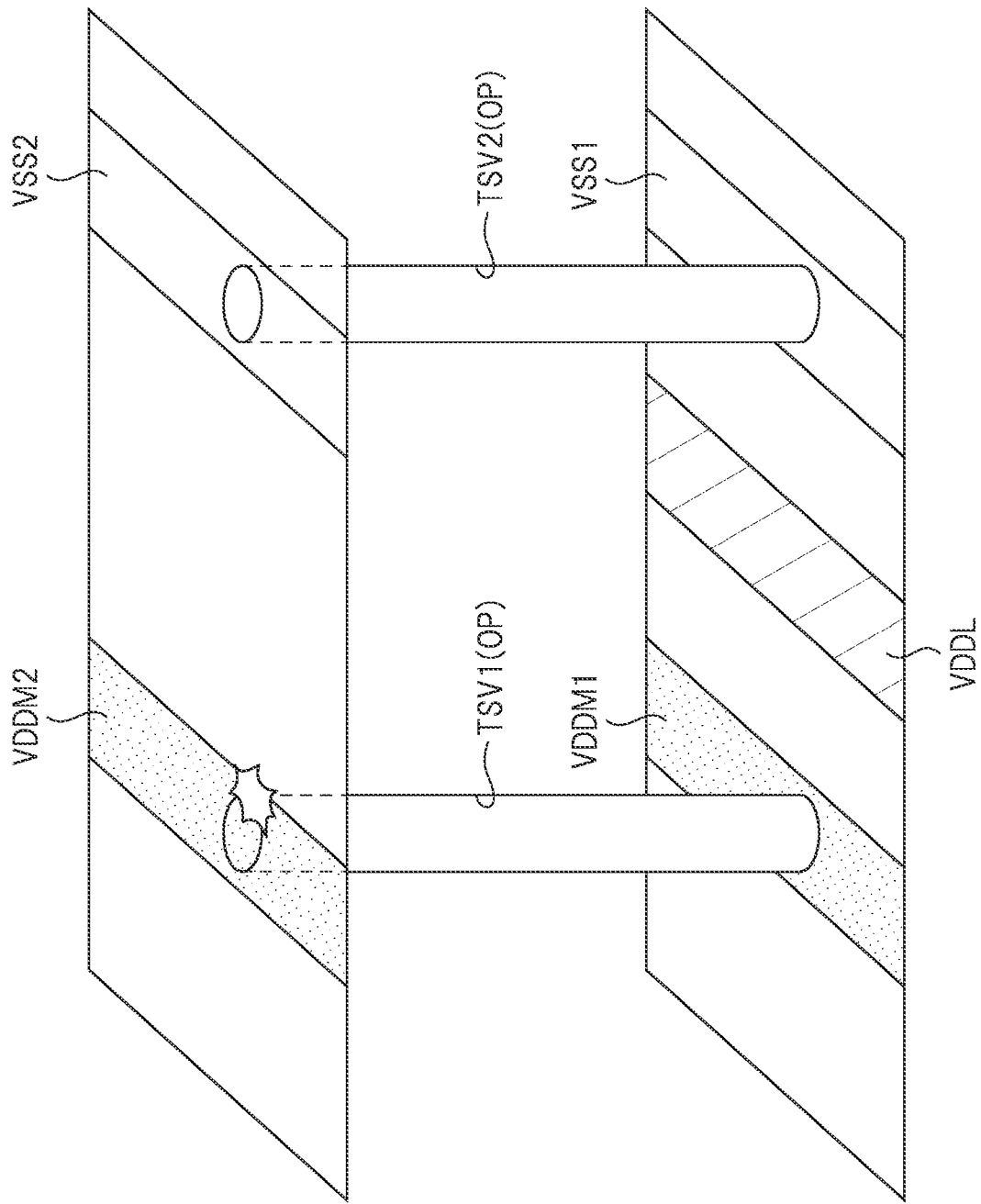
FIG. 5 is a diagram schematically showing a state in which a short-circuit failure occurs in a through via.

Specifically, FIG. 5 is a diagram schematically showing a state where a short-circuit failure occurs in a through via.

FIG. 5 shows a power supply wiring VDDM1 and a ground wiring VSS1 formed on the base chip, and a power supply wiring VDDM2 and a ground wiring VSS2 formed on the memory chip mounted on the base chip.

The power supply wiring VDDM1 formed on the base chip is a wiring for supplying the second power supply potential to a circuit formed on the memory chip, and is electrically connected via the through via TSV1 to the power supply wiring VDDM2 formed on the memory chip.

Further, the ground wiring VSS1 formed on the base chip is a wiring for supplying a ground potential, and is electrically connected via a through via TSV2 to the ground wiring VSS2 formed on the memory chip.

Incidentally, in addition to the power supply wiring VDDM1 and the ground wiring VSS1, formed on the base chip is a power supply wiring VDDL that supplies a first power supply potential different from the second power supply potential to a circuit formed in (on) the base chip itself.

In FIG. 5, for example, it is assumed that dielectric breakdown due to plasma charge-up occurs in the through via TSV1 connecting the power supply wiring VDDM1 formed on the base chip and the power supply wiring VDDM2 formed on the memory chip. In this case, a short-circuit failure occurs at a place (location), at which the dielectric breakdown occurs, and between the substrate (ground potential) around the through via TSV1 and the second power supply potential applied to an internal conductor of the through via TSV1. As a result, the circuit formed on the memory chip may be destroyed.

Meanwhile, for example, it is assumed that dielectric breakdown due to plasma charge-up occurs in the through via TSV2 which connects the ground wiring VSS1 formed on the base chip and the ground wiring VSS2 formed on the memory chip. In this case, the substrate (ground potential) around the through via TSV2 and an internal conductor of the through via TSV2 lead to being conductive at a place where the dielectric breakdown occurs. However, since a potential of the substrate around the through via TSV2 and a potential of the internal conductor of the through via TSV2 are both ground potentials, no short-circuit failure occurs.

Therefore, in the through via TSV2 to which the ground potential is applied, even if dielectric breakdown occurs informing the through hole OP, no short-circuit failure occurs at the place where the dielectric breakdown occurs. In contrast, in the through via TSV1 to which a potential different from the ground potential is applied, if dielectric breakdown occurs in forming the through hole OP, a short-circuit failure occurs between the substrate (ground potential) around the through via TSV2 and a potential which is applied to the internal conductor of the through via TSV2. From this, it can be understood that the dielectric breakdown in the through via TSV2 to which the potential different from the ground potential is applied needs to be suppressed particularly.

As described above, for example, when the plasma charge-up occurs in forming the through hole, the dielectric breakdown occurs on an inner wall of the through hole by an "electron shading effect" and, as a result, a short-circuit failure may occur in the through hole via the through via in which the internal conductor is embedded. From this, for example, in order to improve the manufacturing yield of the base chip, the reliability of the through via needs to be improved. Specifically, it is important to prevent the dielectric breakdown of the through via formed in the base chip. In this regard, there are related techniques described below in order to reduce the dielectric breakdown of the through vias due to the plasma charge-up.

(Explanation of Related Technique)

The "related technique" referred to in the present specification is not a known technique but is a technique having a problem found by the inventors of the present invention, and is a technique that is a premise of the present invention.

Figure 6:
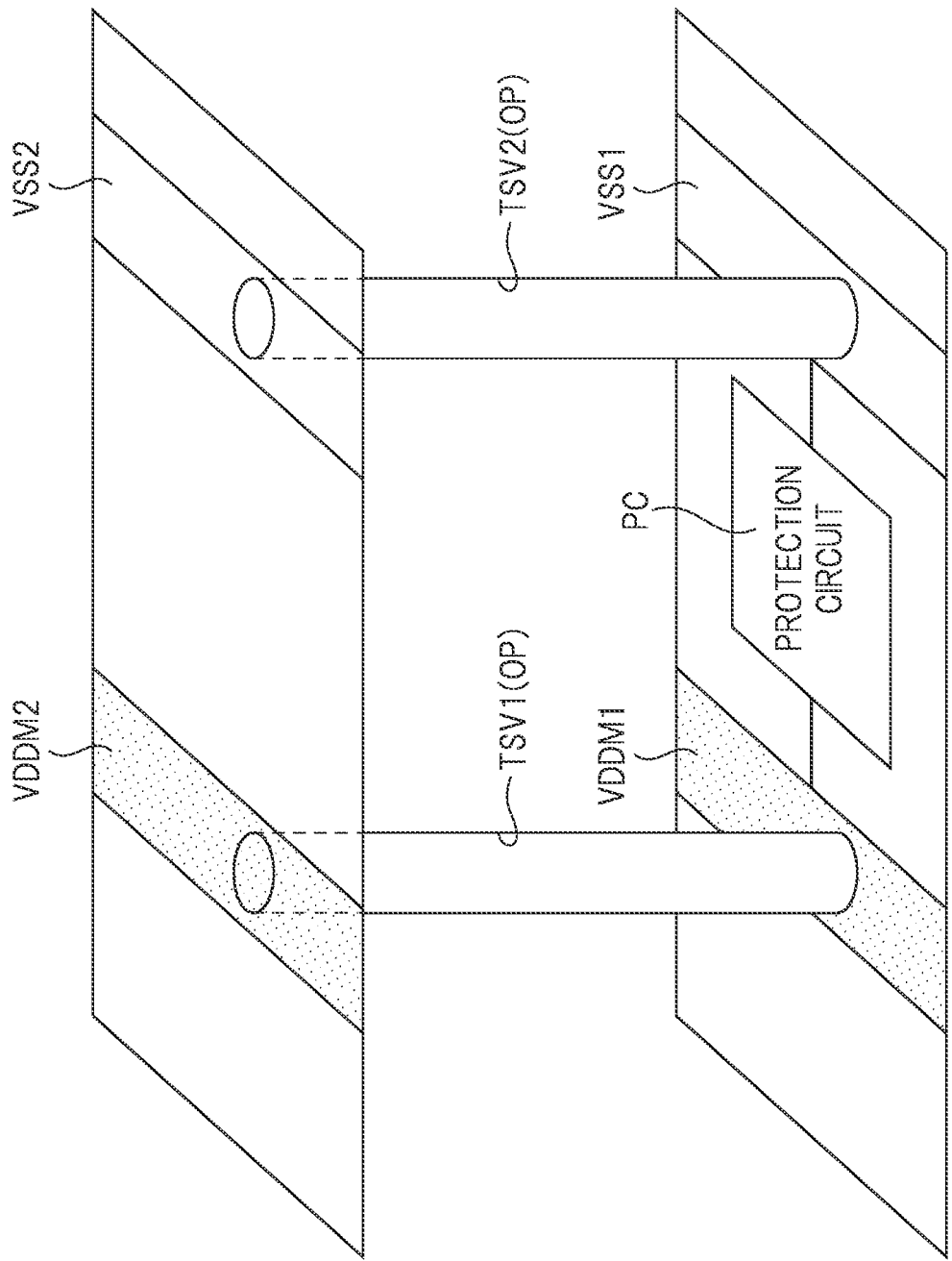
FIG. 6 is a diagram for explaining a related technique.

FIG. 6 is a diagram for explaining a related technique.

In FIG. 6, a protection circuit PC is provided between a power supply wiring VDDM1 and a ground wiring VSS1 that are formed on a base chip. This protection circuit PC has a function of leaking accumulation of electric charges generated in forming through holes OP. As a result, in the related technique having the protection circuit PC, plasma charge-up in the through holes OP can be suppressed, so that dielectric breakdown in the through holes OP can be prevented. According to the related technique, this makes it possible to suppress a short-circuit failure of the through via TSV1 due to the plasma charge-up.

(Room for Improvement in Related Technique)

However, if the protection circuit PC is mounted on the base chip, a chip area of the base chip increases. In particular, the protection circuit PC mounted on the base chip is a protection circuit related to a memory-chip dedicated power supply used in a circuit formed on a memory chip. Namely, as shown in FIG. 6, the protection circuit PC is provided in order to prevent a short-circuit failure in a through via TSV1 connected to a power supply wiring VDDM1 that supplies a second power supply potential to the memory chip. This means that an extra protection circuit PC, which is not originally intended to protect a circuit(s) itself formed on the base chip, must be formed on the base chip. That is, according to the related technique, a protection circuit PC that is not directly related to the base chip must be provided, so that an increase in the chip area of the base chip becomes apparent. This is the room for improvement that exists in the related technique.

Meanwhile, if the protection circuit PC is not provided on the base chip, the short-circuit failure of the through via TSV1 due to the plasma charge-up becomes apparent.

Therefore, in the present embodiment, a devisal (contrivance) is provided to prevent the short-circuit failure in the through via TSV1 connected to the power supply wiring VDDM1 that supplies the second power supply potential to the memory chip without providing the protection circuit PC. Hereinafter, a technical idea in the present embodiment, to which this devisal has been provided, will be described.

(Basic Idea in Embodiment)

A basic idea in this embodiment is to protect other through vias connected to a circuit(s) from dielectric breakdown by intentionally providing the through vias that cause the dielectric breakdown due to plasma charge-up. That is, the basic idea in the present embodiment is a basic idea of preventing the dielectric breakdown of the other through vias connected to the circuit by intentionally providing the through vias that cause no short-circuit failure even if the dielectric breakdown occurs and by causing the dielectric breakdown due to the plasma charge-up in those through vias. According to this basic idea, even if the plasma charge-up occurs, the dielectric breakdown is suppressed in the through via connected to the circuit and, as a result, short-circuit failures in the through vias connected to the circuit are prevented. According to the basic idea, this makes it possible to improve the reliability of the semiconductor device including the through vias.

Specifically, in the basic idea, in addition to the through vias connected to the circuit, the through vias that are not connected to the circuit and have a floating potential are intentionally provided, and the dielectric breakdown is caused by the through vias having the floating potential. As a result, in the basic idea, a bond of electrons and positive ions occurs due to intentional dielectric breakdown in the through via having the floating potential. This means that a charge imbalance is eliminated and a high electric field that causes the dielectric breakdown is mitigated, which leads to being able to protect the other through vias connected to the circuit from the dielectric breakdown. Then, even if the dielectric breakdown occurs in the through via having the floating potential that is not connected to the circuit, no short-circuit failure occurs in the circuit and, as a result, the circuit formed in the semiconductor device can be protected. For example, even if the dielectric breakdown occurs in the through vias having the floating potential, the through vias having the floating potential are only electrically connected to the substrate (ground potential) surrounding the through vias, so that no short-circuit failure is brought between a potential different from the ground potential and the ground potential. Therefore, according to the basic idea in the present embodiment, it is possible to effectively suppress the short-circuit failures in the circuits formed in the semiconductor device without providing the protection circuit as in the related technique described above. In other words, this basic idea can be said to be an excellent technical idea in that the short-circuit failures caused by the dielectric breakdown of the through vias can be suppressed without increasing a chip size of the base chip.

Here, the definition of the through via in the present specification will be described.

First, the through via in the present specification is classified into an "active via", a "grand via", and a "floating via". The "active via" means a through via connected to a circuit in a completed state of a semiconductor device, and is used as a general term including, for example, a via configured to apply a power supply potential or a via configured to apply a ground potential. However, in an uncompleted state of the semiconductor device, even if a through via has a floating potential and is connected to the circuit in the completed state of the semiconductor device, it is included in the "active via". In particular, some vias, which is configured so that the ground potential is applied, among the "active vias" are referred to as "ground vias".

Meanwhile, the "floating via" means a through via that is not connected to the circuit even in the completed state of the semiconductor device and is configured to have a floating potential. Furthermore, as a result of the dielectric breakdown occurring in the "floating via", the "floating via" that becomes conductive with the substrate (ground potential) surrounding the "floating via" is called a "damage via" and is distinguished from the "ground via".

If the basic idea in the present embodiment is re-expressed based on the above definitions, the basic idea in the present embodiment can be said to be an idea in which, by intentionally providing the "floating via" that causes the dielectric breakdown due to the plasma charge-up, other "active vias" connected to the circuit are protected from the dielectric breakdown. Then, in the semiconductor device in which the basic idea of the present embodiment is adopted, at least one of "floating via" and "damaged via" is included in a plurality of through vias. That is, in the semiconductor device in which the basic idea is embodied, realized is any: of an aspect in which all the "floating vias" are dielectrically broken down and become the "damaged vias"; an aspect in which some of the "floating vias" are dielectrically broken down and the "floating vias" and "damaged vias" coexist; and an aspect in which all the "floating vias" remain without causing the dielectric breakdown.

Hereinafter, the basic idea in the present embodiment will be explained with reference to the drawings.

Figure 7:
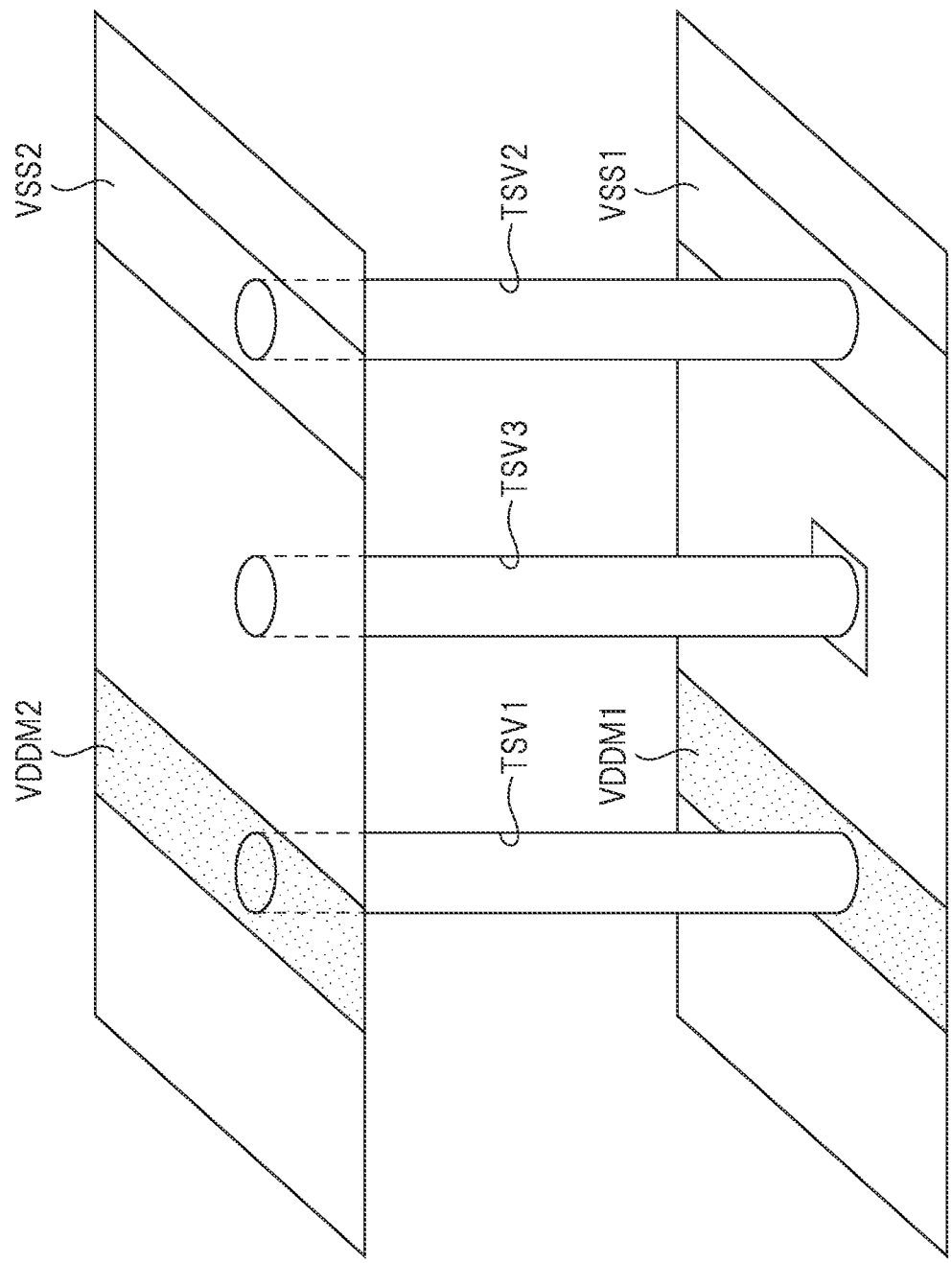
FIG. 7 is a diagram schematically showing an "active via" and a "floating via".

FIG. 7 is a diagram schematically showing an "active via" and a "floating via".

In FIG. 7, a power supply wiring VDDM1 formed on the base chip and a power supply wiring VDDM2 formed on the memory chip are connected by a through via TSV1. At this time, since the power supply wiring VDDM2 formed on the memory chip has a function of supplying a second power supply potential to an integrated circuit (memory circuit etc.) formed on the memory chip, the power supply wiring VDDM2 leads to being connected to the circuit. As a result, the through via TSV1 that connects the power supply wiring VDDM1 and the power supply wiring VDDM2 is also connected to the circuit. Therefore, the through via TSV1 connecting the power supply wiring VDDM1 and the power supply wiring VDDM2 becomes an "active via".

Similarly, a ground wiring VSS1 formed on the base chip and a ground wiring VSS2 formed on the memory chip are connected by a through via TSV2. Since the ground wiring VSS1 and the ground wiring VSS2 each have a function of supplying the ground potential to the integrated circuit, the through via TSV2 connecting the ground wiring VSS1 and the ground wiring VSS2 is also connected to the circuit. As a result, the through via TSV2 becomes an "active via" and, in particular, since the ground potential is applied, the through via TSV2 becomes a "ground via" among the "active vias".

Meanwhile, in FIG. 7, a through via TSV3 is not formed in the circuit or the memory chip formed on the base chip and has a floating potential, and so becomes a "floating via". Here, the basic idea in the present embodiment is to provide a "floating via" that intentionally causes dielectric breakdown in order to protect the "active via" from the dielectric breakdown caused by plasma charge-up. However, the "floating via" needs to be more easily dielectrically broken down than the "active via" in order to embody this idea.

In this regard, in order to make the "floating via" broken down more easily than the "active via", it is important that the "floating via" is not connected to the circuit also in a completed state of the semiconductor device in addition to an uncompleted state of the semiconductor device, and has a floating potential. In other words, the "floating via" is more easily dielectrically broken down than the "active via" precisely because having a floating potential.

Below, explained will be a qualitative mechanism in which a "floating via" more easily causes dielectric breakdown due to plasma charge-up than an "active via".

Figure 8:
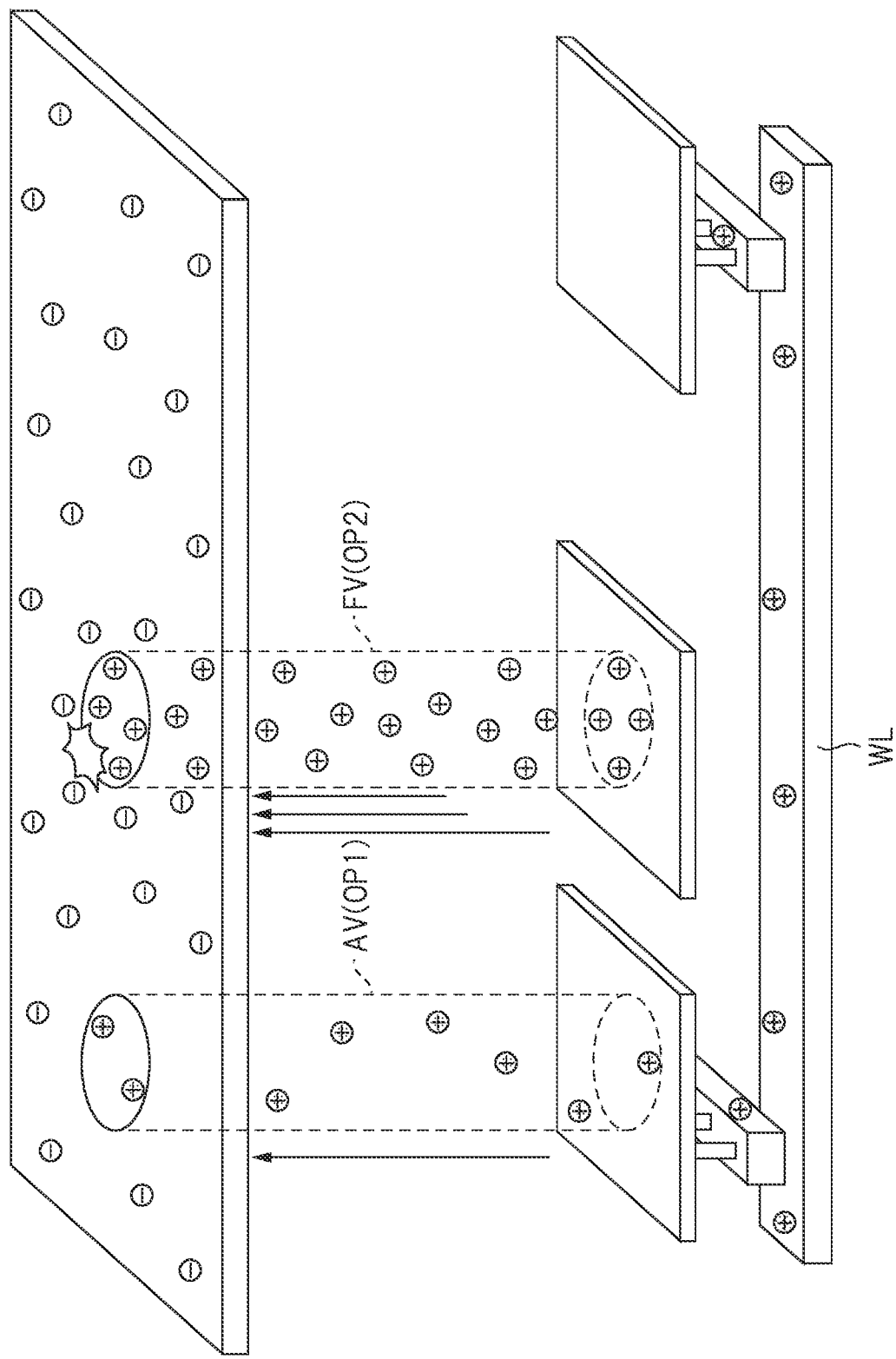
FIG. 8 is a diagram for explaining a qualitative mechanism in which the "floating via" more easily causes dielectric breakdown due to plasma charge-up than the "active via".

FIG. 8 is a diagram for explaining a qualitative mechanism in which a "floating via" more easily causes dielectric breakdown due to plasma charge-up than an "active via".

FIG. 8 shows a through hole OP1 of an active via AV and a through hole OP2 of a floating via FV. Here, the active via AV is electrically connected to the circuit, and so leads to being connected to a long-extending wiring WL, for example, as shown in FIG. 8. Meanwhile, the floating via FV is not electrically connected to the circuit, and so is not connected to the long-extending wiring. Due to this difference, the through hole OP2 of the floating via FV is more easily to dielectrically broken down than the through hole OP1 of the active via AV.

For example, as shown in FIG. 8, in forming the through hole OP1 of the active via AV, positive ions are accumulated on an inner wall of the through hole OP1 due to a "electron shading effect".

However, the through hole OP1 of the active via AV is connected to a long extending wiring WL, so that positive ions do not localize to the inner wall of the through hole OP1 and diffuse to the wiring WL as well. As a result, density of positive ions accumulated in the inner wall of the through hole OP1 of the active via AV becomes small. This means that a high electric field is less likely to be generated inside the through hole OP1, so that dielectric breakdown due to plasma charge-up is less likely to occur in the through hole OP1 of the active via AV.

In contrast, positive ions are also accumulated on an inner wall of the floating via FV due to the "electron shading effect". Here, the through hole OP2 of the floating via FV is not electrically connected to the circuit. That is, the through hole OP2 of the floating via FV extends long or is not connected to the wiring. From this, the positive ions accumulated in the inner wall of the through hole OP2 of the floating via FV cannot diffuse, and stay on the inner wall of the through hole OP2. As a result, density of positive ions in the through hole OP2 of the floating via FV increases (becomes high). This means that a high electric field is easily generated inside the through hole OP2, so that the dielectric breakdown due to the plasma charge-up is likely to occur in the through hole OP2 of the floating via FV. By the above-mentioned qualitative mechanism, the dielectric breakdown due to the plasma charge-up is more likely to occur in the through hole OP2 of the floating via FV than in the through hole OP1 of the active via AV.

In this way, according to the basic idea in the present embodiment, intentionally providing the "floating vias" that cause the dielectric breakdown due to the plasma charge-up makes it possible to protect, from the dielectric breakdown, other "active vias" connected to the circuit.

In particular, the "floating beer" provided in the basic idea has two important technical significances. That is, the first technical significance is that the "floating via" is not connected to a wiring for connecting with the circuit for the reason to have a floating potential and, as a result, the "floating via" has higher electric field density of positive ions than that of the "active via", which leads to be more easily dielectrically broken down than the "active via". The second technical significance is that even if the dielectric breakdown occurs in the "floating via", a short-circuit failure between different potentials does not occur.

In the basic idea, in view of these two technical significances that the "floating via" has, the "floating via" is provided for intentional dielectric breakdown, and the "active via" that may cause the short-circuit failure after the dielectric breakdown is protected. According to the basic idea, this makes it possible to protect the circuit formed in the semiconductor device from the short-circuit failure caused by the plasma charge-up and, as a result, the reliability of the semiconductor device can be improved.

(New Findings made by Present Inventors)

Next, new findings made by the present inventors will be described.

One of causes of the plasma charge-up is the "electron shading effect" and, as another cause, spatial non-uniformity of plasma is known. However, where the spatial non-uniformity of plasma is apparent has not been investigated at present. Regarding this point, as a result of diligent studies, the present inventors have made a novel finding(s) about the spatial non-uniformity of plasma as shown below, and it will be described.

Figure 9:
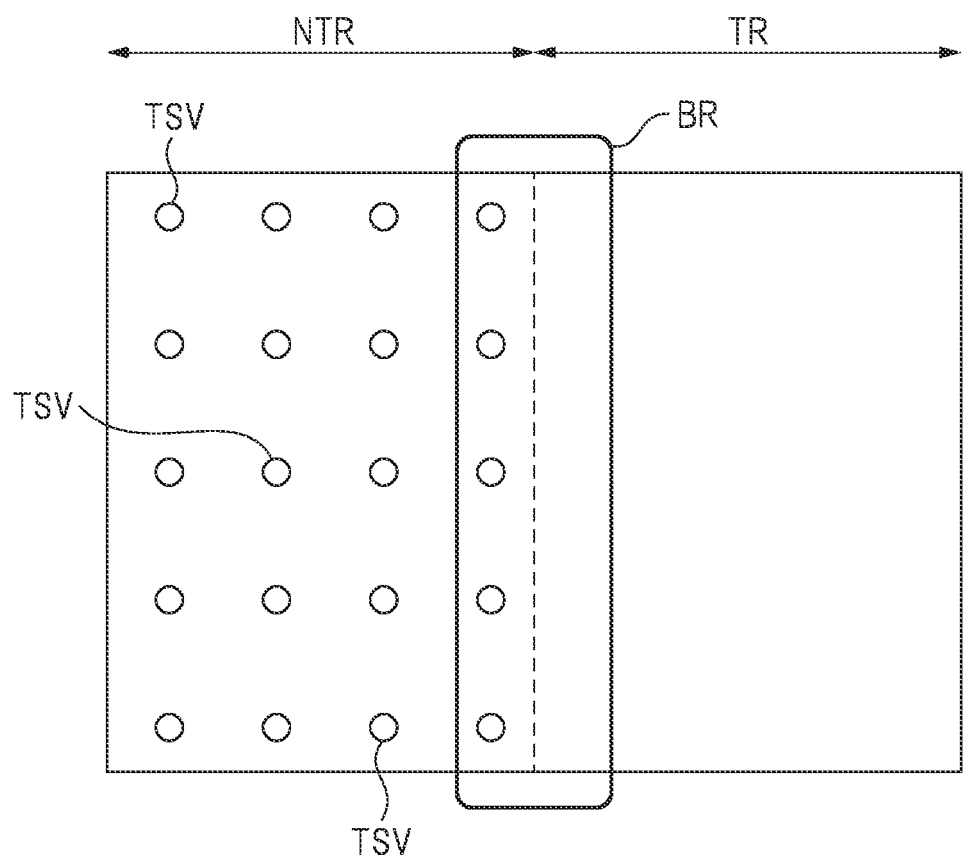
FIG. 9 is a diagram for explaining a portion at which spatial non-uniformity of plasma occurs.

FIG. 9 is a diagram for explaining a place where the spatial non-uniformity of the plasma occurs.

FIG. 9 shows, for example, an enlarged plan view of a part of a region of the base chip. In FIG. 9, a transistor region TR is, for example, a region in which an integrated circuit including a field effect transistor is formed. Specifically, active diffusion layers serving as a source region and a drain region of the field effect transistor are formed in the transistor region TR.

Meanwhile, a non-transistor region NTR is, for example, a region in which an integrated circuit including the field effect transistor is not formed. In this non-transistor region NTR, since the field effect transistor is not formed, forming the active diffusion layers serving as a source region and a drain region is unnecessary, but from the viewpoint of improving microfabrication accuracy of the entire base chip, a diffusion layer is also formed in the non-transistor region NTR. However, a diffusion layer formed in the non-transistor region NTR does not function as a source region and a drain region, so that it is referred to as an inactive diffusion layer. Further, a plurality of through vias TSVs are formed in the non-transistor region NTR.

The present inventors have newly found that the spatial non-uniformity of plasma becomes apparent in a boundary region BR between the transistor region TR and the non-transistor region NTR as shown in FIG. 9. For example, arrangement density of the active diffusion layer formed in the transistor region TR is different from arrangement density of the inactive diffusion layer formed in the non-transistor region NTR, and no through via TSV is formed in the transistor region TR. From this, the arrangement density of the diffusion layer and arrangement density of the through via TSV are different in the transistor region TR and the non-transistor region NTR. Then, the present inventors have newly found that non-uniformity occurs between the plasma charge density accumulated in the transistor region TR and plasma charge density accumulated in the non-transistor region NTR by the difference between the arrangement density of the diffusion layer and the arrangement density of the through via TSV. That is, in the boundary region BR between the transistor region TR and the non-transistor region NTR, the spatial non-uniformity of the plasma due to the difference between the arrangement density of the diffusion layer and the arrangement density of the through via TSV becomes apparent. Thus, a high electric field is generated in the boundary region BR based on the spatial non-uniformity of the plasma. As a result, the through via TSV arranged at the closest place (position) to the boundary region BR easily brings occurrence of the dielectric breakdown due to not only the "electron shading effect" but also the spatial non-uniformity of the plasma.

By combining those findings with the basic idea in the present embodiment, the following specific aspects have been realized and, subsequently, these specific aspects will be described.

(First Specific Aspect)

Figure 10:
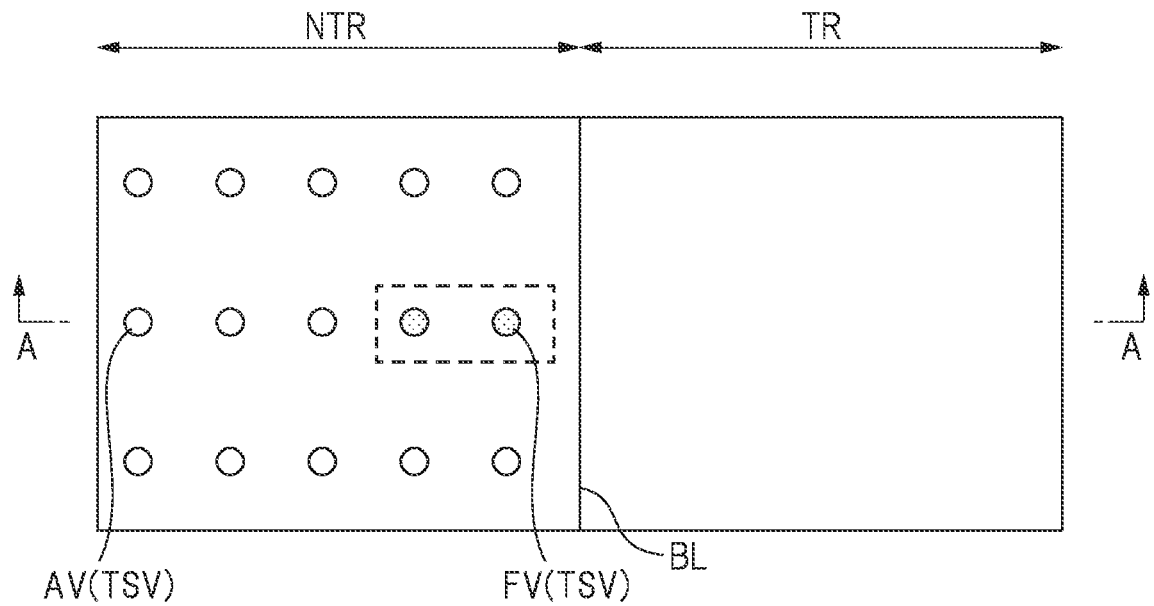
FIG. 10 is a diagram schematically showing the vicinity of a boundary region between a transistor region and a non-transistor region formed on a base chip.

FIG. 10 is a diagram schematically showing the vicinity of a boundary region between a transistor region TR and a non-transistor region NTR formed on the base chip. The base chip is, for example in a semiconductor device having a laminated structure in which a plurality of semiconductor chips are laminated, a semiconductor chip arranged in the lowermost layer among the plurality of semiconductor chips constituting the laminated structure. As shown in FIG. 10, a transistor region TR in which a field effect transistor is formed, and a non-transistor region NTR in which a field effect transistor is not formed exist in in such a base chip. Then, as shown in FIG. 10, no through via is formed in the transistor region TR, while a plurality of through vias TSV are formed in the non-transistor region NTR. Here, an active via AV and floating vias FV exist in the plurality of through vias TSV formed in the non-transistor region NTR. At this time, at least a part of the through vias TSV arranged at the closest place to a boundary line BL between the transistor region TR and the non-transistor region NTR in a plan view becomes a floating via FV.

Figure 11:
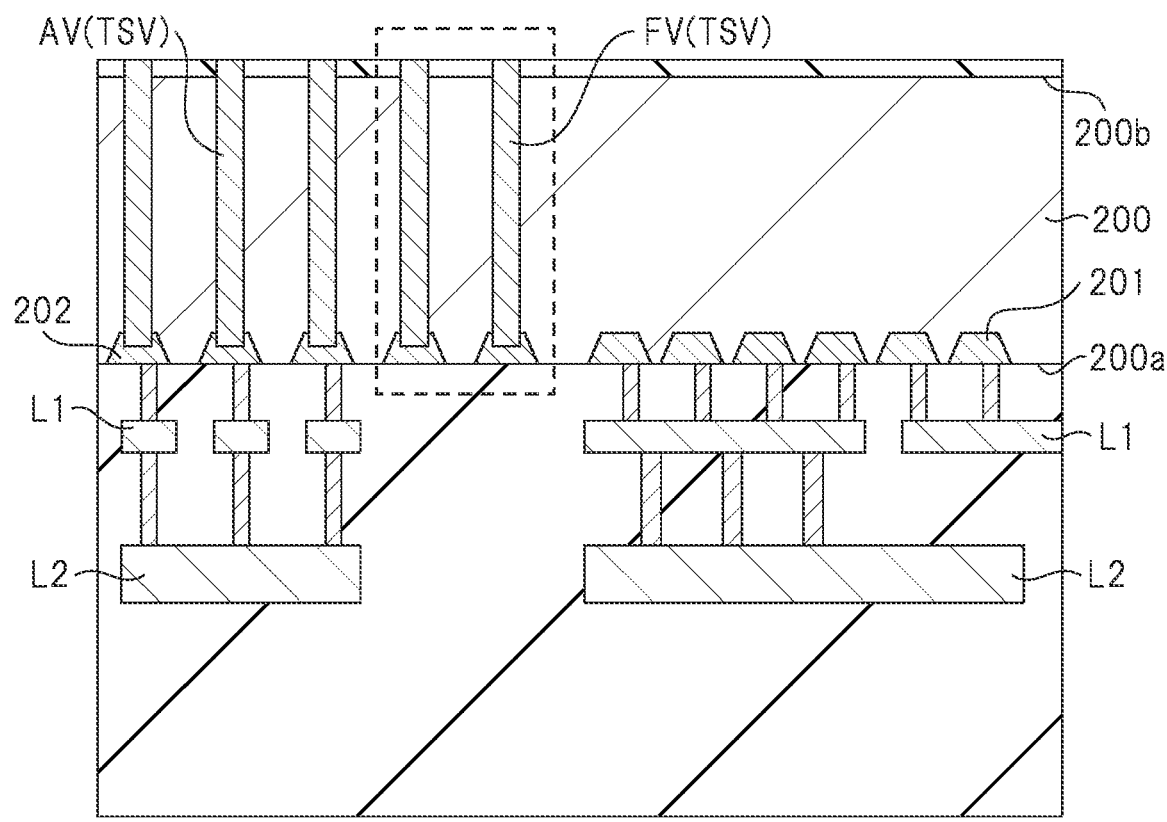
FIG. 11 is a cross-sectional view taken along line A-A of FIG. 10.

Next, FIG. 11 is a cross-sectional view taken along the line A-A of FIG. 10.

As shown in FIG. 11, on a front surface side of a semiconductor substrate 200 having a front surface 200a and a back surface 200b, diffusion layers are formed in both the transistor region TR and the non-transistor region NTR. The diffusion layer formed in the transistor region TR is an active diffusion layer 201 that functions as a source region and a drain region of the field effect transistor. Meanwhile, the diffusion layer formed in the non-transistor region NTR is an inactive diffusion layer 202 that does not function as a source region and a drain region. Here, arrangement density of the active diffusion layer 201 formed in the transistor region TR is higher than arrangement density of the inactive diffusion layer 202 formed in the non-transistor region NTR.

The active diffusion layer 201 is connected to a first layer wiring L1 and a second layer wiring L2. In the transistor region TR, an integrated circuit is configured by electrically connecting the field effect transistor, the first layer wiring L1, and the second layer wiring L2. That is, the integrated circuit leads to being formed in the transistor region TR. Meanwhile, in the non-transistor region NTR, the active vias AV and the floating vias FV are formed, and the active via AV is connected to, for example, the first layer wiring L1 and the second layer wiring L2. The active via AV is electrically connected to the integrated circuit formed in the transistor region TR via the first layer wiring L1 and the second layer wiring L2. In contrast, the floating via FV is not electrically connected to the first layer wiring L1 and the second layer wiring L2. That is, the floating via FV is not connected to the circuit and has a floating potential.

Although not shown, for example, a memory chip is mounted on the base chip configured in this way. Then, the active via AV shown in FIG. 11 is electrically connected to the memory chip. Specifically, the active via AV functions as a power supply path to be supplied to a circuit formed in the memory chip.

Not formed on the base chip in the present embodiment is a protection circuit configured to suppress destruction of the active via AV due to plasma charge-up. This is because the floating via FV having a function of suppressing the destruction of the active via AV due to the plasma charge-up is provided in the present embodiment. In particular, the floating via FV is arranged at a place at which destruction due to plasma charge-up is more easily caused than a place of the active via AV. Specifically, as shown in FIG. 11, at least one of the plurality of floating vias FV is arranged at the closest place to the boundary line BL between the transistor region TR and the non-transistor region NTR in a plan view.

((Feature of First Specific Aspect))

Subsequently, a feature point of the first specific aspect will be described.

A feature point of the first specific aspect is, for example, as shown in FIGS. 10 and 11, that at least one of the plurality of through vias TSV arranged at the closest places to the boundary line BL between the transistor region TR and the non-transistor region NTR is the floating via FV. According to the first specific aspect, this makes it possible to protect the active via AV formed in the non-transistor region NTR from the dielectric breakdown caused by the plasma charge-up. This is because, in the vicinity of the boundary line BL between the transistor region TR and the non-transistor region NTR, not only the "electron shading effect" but also the spatial non-uniformity of the plasma due to the difference between the arrangement density of the diffusion layer and the arrangement density of the through via TSV become apparent and, as a result, a high electric field due to the plasma charge-up is generated. Namely, since the floating via FV that more easily causes the break down than the active via AV is provided at the closest place to the boundary line BL at which such a high electric field is generated, the dielectric breakdown can be intentionally caused in the floating via FV and, as a result, dielectric breakdown at the other active vias AV can be prevented. In this case, even if the floating via FV causes the dielectric breakdown, the floating via FV is connected to no circuit, thereby bringing no short-circuit failure, so that the reliability of the semiconductor device can be ensured.

From the above, according to the first specific aspect, the floating via FV for intentionally causing the dielectric breakdown is provided in the vicinity of the boundary line BL between the transistor region TR and the non-transistor region NTR, at which the highest electric field is most easily generated due to the "electron breakdown effect" and the spatial non-uniformity of the plasma, so that the active via AV, which may cause a short-circuit failure when the dielectric breakdown occurs, is protected. As a result, according to the first specific aspect, since the intentional dielectric breakdown is caused in the floating via FV having no concern about the short-circuit failure even if the dielectric breakdown occurs, the circuit(s) formed in the semiconductor device can be protected from the short-circuit failure due to the plasma charge-up. That is, according to the specific aspect, the reliability of the semiconductor device can be improved.

(Second Specific Aspect)

Next, a second specific aspect will be described.

Figure 12:
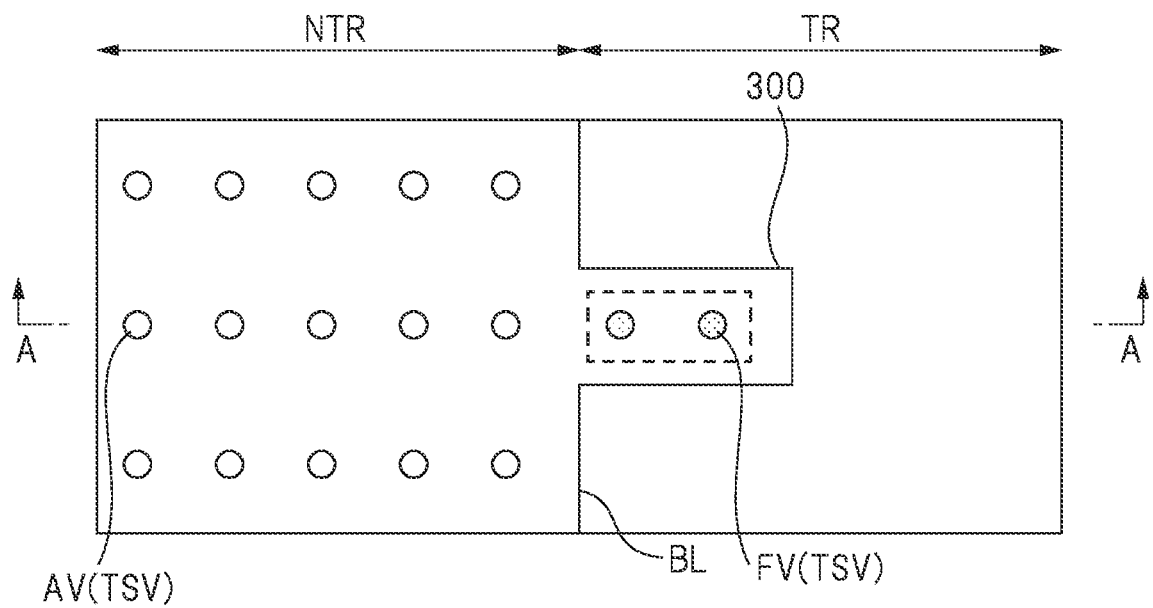
FIG. 12 is a diagram schematically showing the vicinity of the boundary region between the transistor region and the non-transistor region formed on the base chip.
Figure 13:
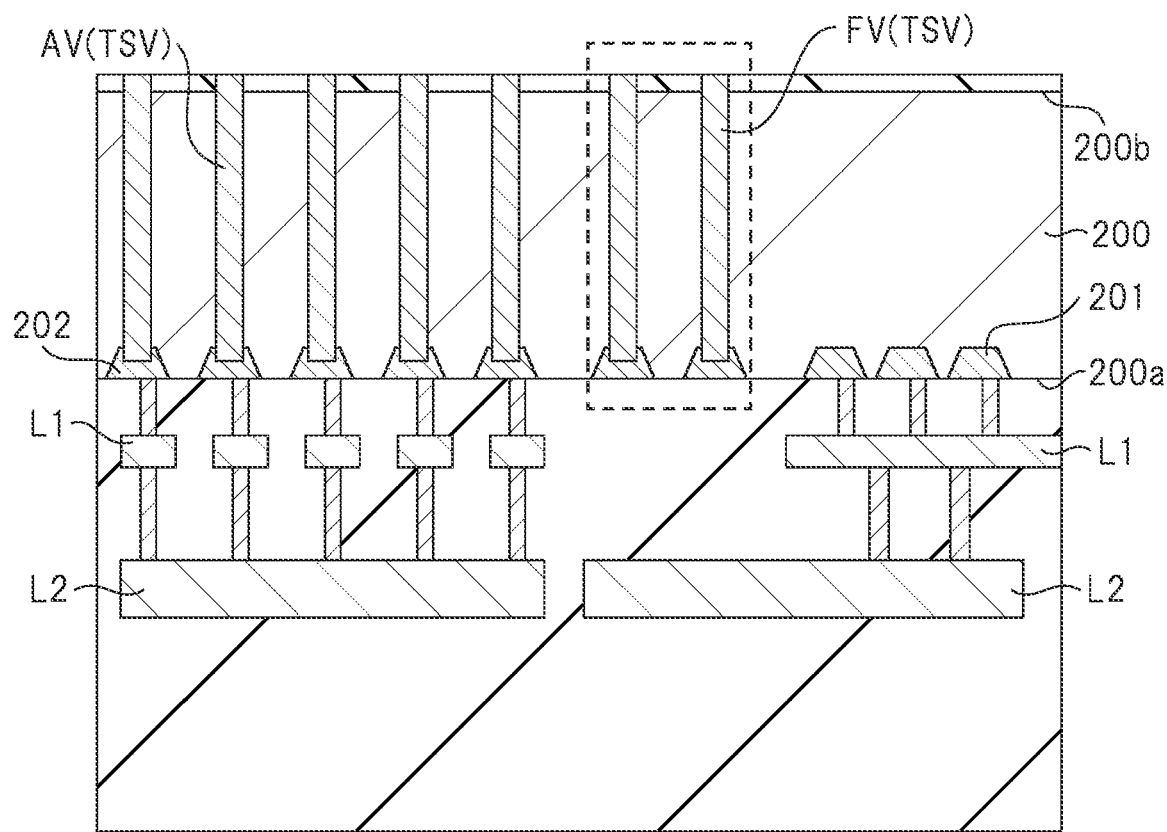
FIG. 13 is a cross-sectional view taken along line A-A of FIG. 12.

FIG. 12 is a diagram schematically showing the vicinity of the boundary region between the transistor region TR and the non-transistor region NTR formed on the base chip. Further, FIG. 13 is a cross-sectional view taken along line A-A of FIG. 12. In FIG. 12, the boundary line BL between the transistor region TR and the non-transistor region NTR includes a convex portion 300 protruding from the non-transistor region NTR toward the transistor region TR in a plan view, and floating vias FV are formed in the convex portion 300.

According to a second specific aspect, this makes it possible to intentionally cause dielectric breakdown in the floating vias FV. A reason for this will be explained below.

Figure 14:
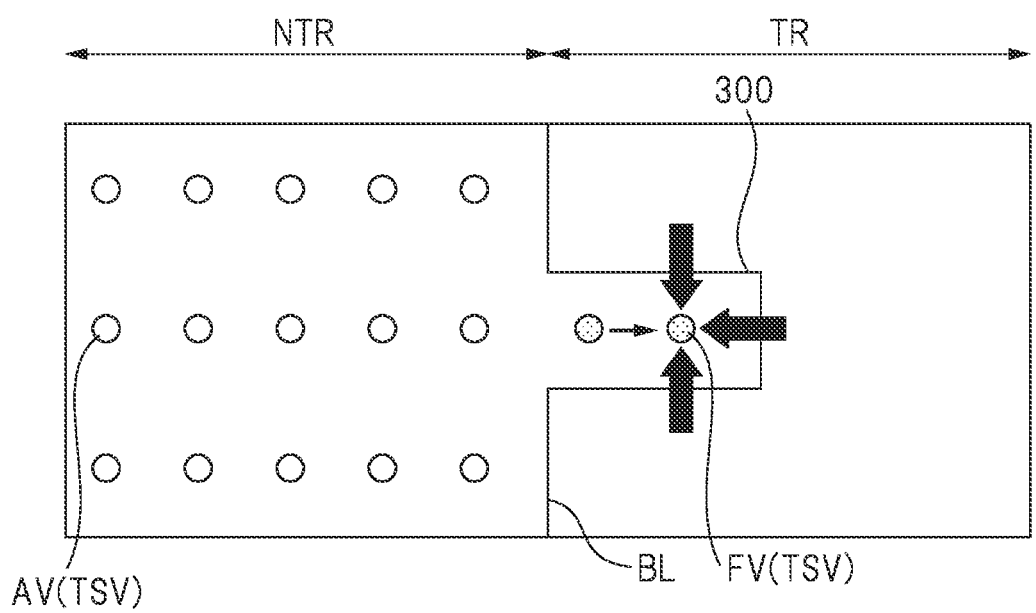
FIG. 14 is a diagram for explaining the reason why dielectric breakdown easily occurs according to the floating via arranged in a convex portion of a boundary line.

FIG. 14 is a diagram for explaining the reason why dielectric breakdown is easily caused by the floating vias FV arranged in the convex portion 300 of the boundary line BL. In FIG. 14, a high electric field based on the spatial non-uniformity of the plasma is applied to the floating via FV arranged in the convex portion 300 of the boundary line BL from directions indicated by four arrows in FIG. 14. Thus, the floating via FV arranged in the convex portion 300 of the boundary line BL more easily causes the dielectric breakdown than the through vias TSV arranged at the other places. From this, according to the second specific aspect, since the probability that the floating via FV arranged in the convex portion 300 of the boundary line BL is dielectrically broken down becomes high, the active vias AV arranged at the other places can be effectively protected from the dielectric breakdown caused by the plasma charge-up. In this way, in the second specific aspect, a devisal of a shape of the boundary line BL creates a place (s) where the high electric field is effectively generated, and arrangement of the floating via FV at this place can cause the dielectric breakdown with high probability. As a result, according to the second specific aspect, the circuit formed in the semiconductor device can be protected from the short-circuit failure caused by the plasma charge-up, which makes it possible to improve the reliability of the semiconductor device.

(Third Specific Aspect)

Subsequently, a third specific aspect will be described.

Figure 15:
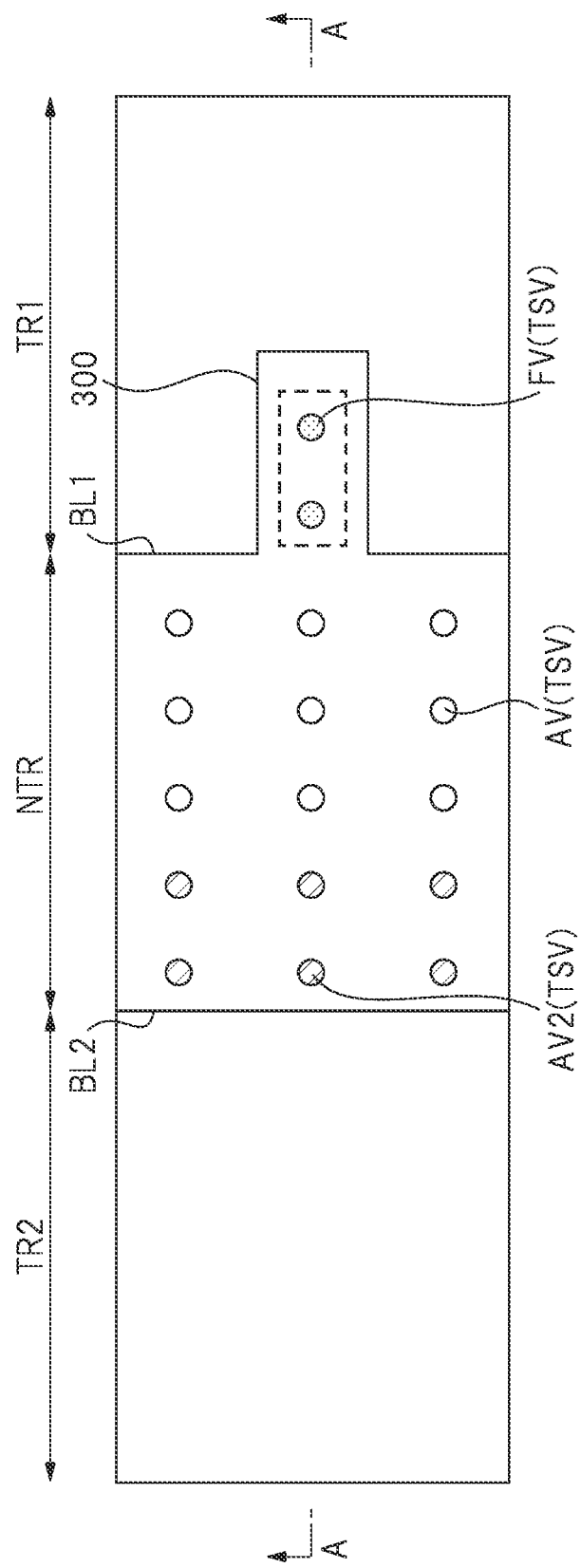
FIG. 15 is a diagram schematically showing the vicinity of a first boundary region between a first transistor region and the non-transistor region formed on the base chip, and the vicinity of a second boundary region between a second transistor region and the non-transistor region formed on the base chip.
Figure 16:
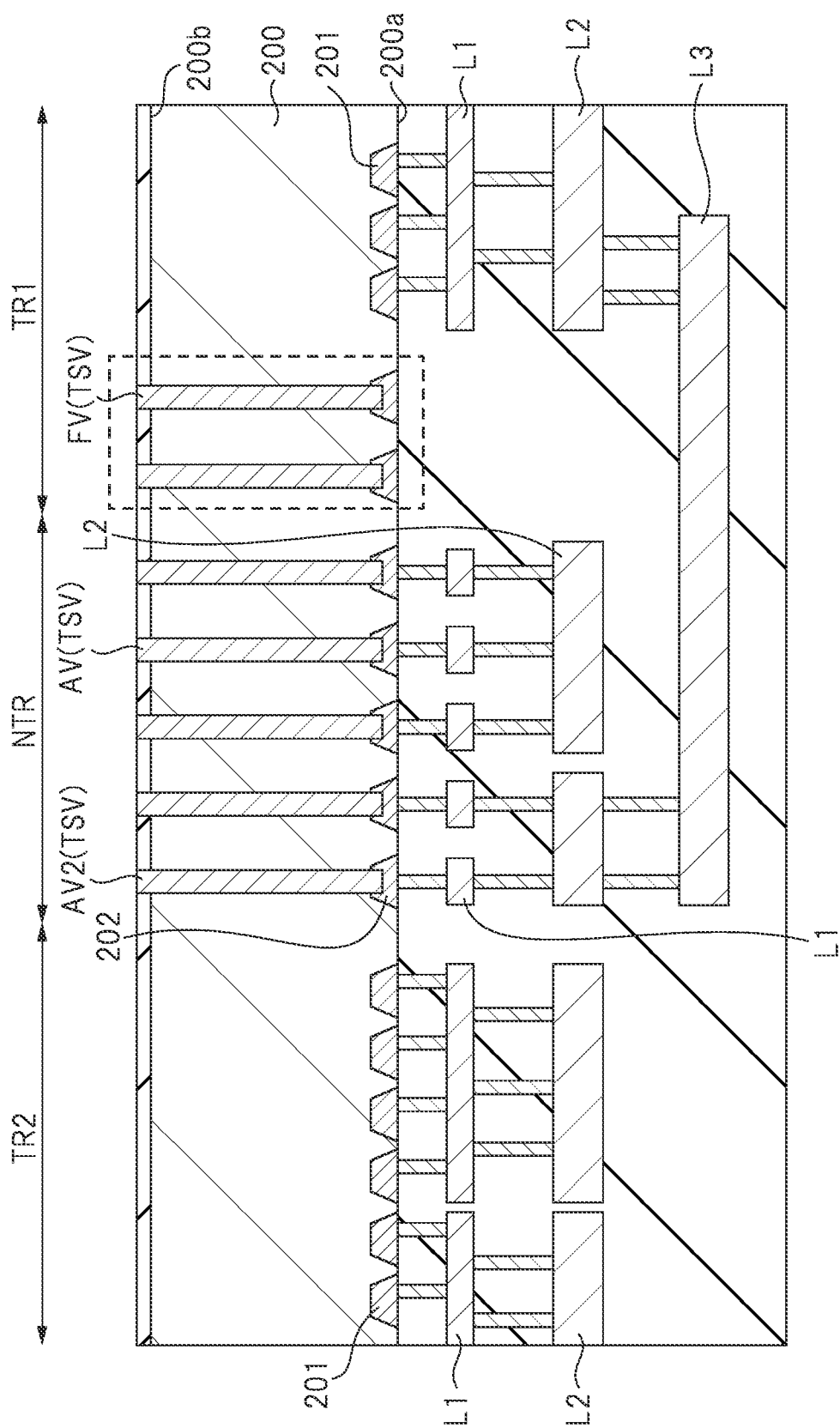
FIG. 16 is a cross-sectional view taken along line A-A of FIG. 15.

FIG. 15 schematically shows the vicinity of a first boundary region between a first transistor region TR1 and a non-transistor region NTR and the vicinity of a second boundary region between a second transistor region TR2 and a non-transistor region NTR, which are formed on the base chip. Further, FIG. 16 is a cross-sectional view taken along line A-A of FIG. 15. In FIG. 15, a boundary line BL1 between the first transistor region TR1 and the non-transistor region NTR includes a convex portion 300 protruding from the non-transistor region NTR toward the first transistor region TR1 in a plan view, and floating vias FV are formed in the convex portion 300. Meanwhile, the boundary line BL2 between the second transistor region TR2 and the non-transistor region NTR is not provided with a convex portion. Then, in addition to the floating vias FV, active vias AV and active vias AV2 are provided in the non-transistor region NTR. The active AV is a through via that is connected to the circuit but is not electrically connected to a protection circuit that protects the active via AV from the plasma charge-up. In contrast, the active via AV2 is a through via that is electrically connected to a protection circuit that protects the active via AV2 from the plasma charge-up. Here, the active via AV2 connected to the protection circuit is arranged at least at the closest place to the boundary line BL2 between the second transistor region TR2 and the non-transistor region NTR. For example, as shown in FIG. 16, the active via AV2 is electrically connected via a first layer wiring L1, a second layer wiring L2, and a third layer wiring L3 to a protection circuit included in an integrated circuit formed in the transistor region TR1.

According to the third specific aspect configured in this way, the following advantages can be obtained. That is, as shown in FIG. 15, since the floating via FV is formed in the convex portion 300 of the boundary line BL1 where the high electric field due to the plasma charge-up is generated, the dielectric breakdown can be intentionally caused at the floating via FV. From this, the active via AV formed in the non-transistor region NTR can be protected from the dielectric breakdown. Further, in the third specific aspect, the active via AV2 connected to the protection circuit is arranged in a region near the boundary line BL2 where the high electric field due to the plasma charge-up is generated, so that the dielectric breakdown of the active via AV2 can be prevented even if the high electric field due to the plasma charge-up is generated in the region near the boundary line BL2.

In particular, in the third specific aspect, the through vias TSV connected to the protection circuit do not need to be provided both in the vicinity of the boundary line BL1 and in the vicinity of the boundary line BL2, so that the number of protection circuits formed on the base chip can be reduced. According to the third specific aspect, this makes it possible to protect the through via TSV from the dielectric breakdown due to the plasma charge-up without increasing a chip size of the base chip (first advantage). Further, in the third specific aspect, the convex portions 300 do not need to be provided both in the vicinity of the boundary line BL1 and in the vicinity of the boundary line BL2, so that the following advantage is obtained: occupied areas of the transistor regions (first transistor region TR1 and second transistor region TR2) can be ensured and the number of floating vias FV to be intentionally dielectrically broken down do not need to be provided more than necessary (second advantage). Therefore, according to the third specific aspect, both the first advantage and the second advantage described above can be obtained by using the active via AV2 connected to the floating via FV and the protection circuit.

(Application Example)

In the embodiment, the floating via FV having a floating potential is provided to intentionally cause the dielectric breakdown due to the plasma charge-up. When the dielectric breakdown occurs, this floating via FV leads to becoming conductive with a substrate of the ground potential through a place where the dielectric breakdown occurs, thereby becoming a "damage via".

Here, the "damage via" itself does not cause a short-circuit failure in the integrated circuit, and so may be left as it is. However, for example, it is conceivable that the reliability of the semiconductor device starting from this "damage via" may decrease for a secular change due to a temperature change or the like. Therefore, in the present application example, described will be a devisal for reducing a potential of reliability deterioration due to the "damage via".

Figure 17:
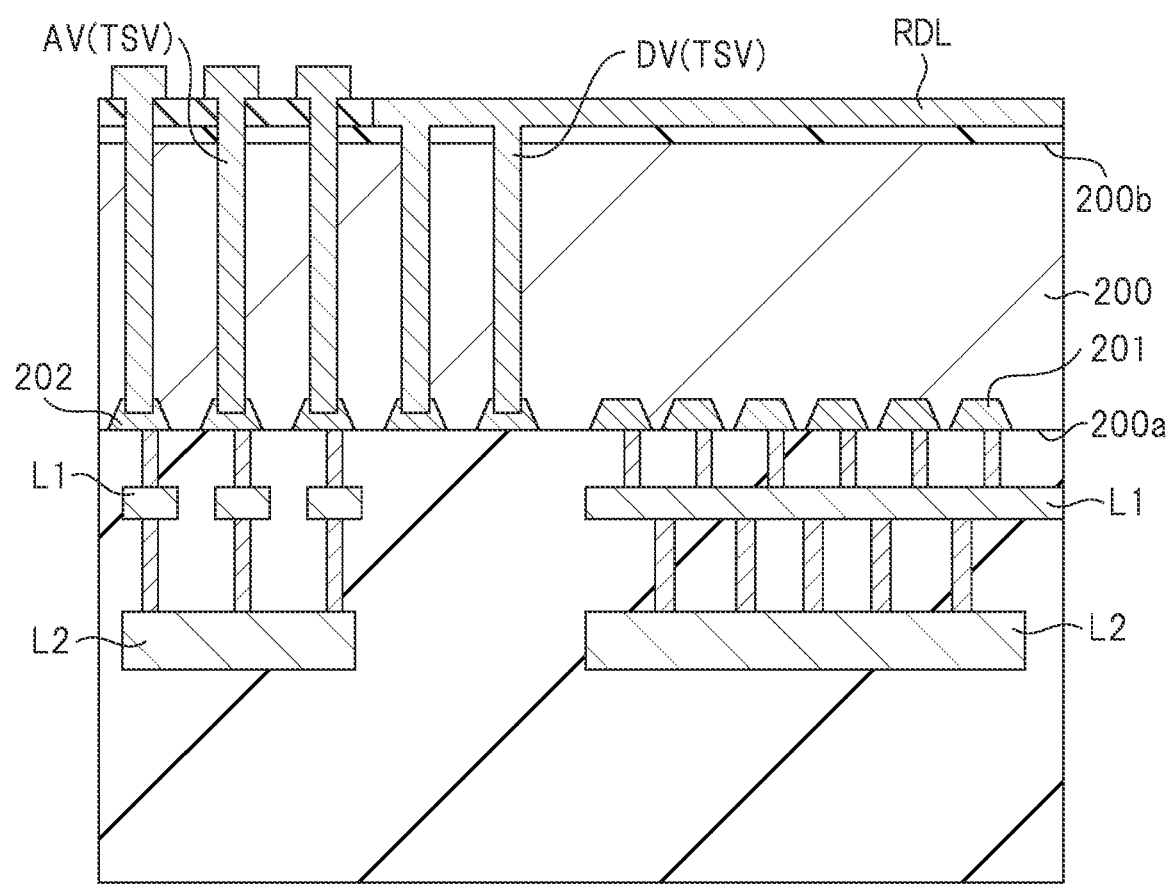
FIG. 17 is a diagram for explaining a devisal in an application example.

FIG. 17 is a diagram for explaining a devisal in an application example.

In FIG. 17, a damaged via DV formed by dielectric breakdown being caused in a floating via is connected to a rewiring (back surface wiring) RDL to which the ground potential is supplied. This brings the following: a dielectric breakdown portion(s) existing in the damaged via DV is repaired and covered by the rewiring RDL. As a result, according to the application example, the dielectric breakdown portion existing in the damaged via DV is not exposed, so that a potential of lowering the reliability of the semiconductor device can be reduced.

As described above, although the invention made by the present inventors has been specifically explained based on the embodiment thereof, the present invention is not limited to the embodiment and, needless to say, can be variously modified within a range of not departing from the scope thereof.

What is claimed is:

1. A semiconductor device comprising:
a first semiconductor chip having a first transistor region and a non-transistor region; and
a plurality of through vias formed in the non-transistor region,
wherein the plurality of through vias include:
an active via electrically connected to a circuit; and
a floating via having a floating potential,
wherein the non-transistor region is arranged between the first transistor region and a second transistor region in a plan view, and
wherein the plurality of through vias arranged at a closest place to a first boundary line between the second transistor region and the non-transistor region in a plan view are a plurality of active vias composed of the active via electrically connected to a protection circuit.

2. The semiconductor device according to claim 1, wherein at least a part of the through vias arranged at a closest place to a second boundary line between the first transistor region and the non-transistor region in a plan view is the floating via.

3. The semiconductor device according to claim 1, wherein arrangement density of a diffusion layer formed in the first transistor region is higher than arrangement density of a diffusion layer formed in the non-transistor region.

4. The semiconductor device according to claim 1, wherein no through via is formed in the first transistor region.

5. The semiconductor device according to claim 1, further comprising a second semiconductor chip laminated on the first semiconductor chip, wherein the active via is electrically connected to the second semiconductor chip.

6. The semiconductor device according to claim 5, wherein the active via functions as a supply path for power supplied to a circuit formed on the second semiconductor chip.

7. The semiconductor device according to claim 6, wherein a protection circuit configured to suppress destruction of the active via due to plasma charge-up is not formed on the first semiconductor chip.

8. The semiconductor device according to claim 1, wherein the floating via has a function of suppressing destruction of the active via due to plasma charge-up.

9. The semiconductor device according to claim 1, wherein the floating via is arranged at a place where destruction due to plasma charge-up more easily occurs than that of the active via.

10. The semiconductor device according to claim 2, wherein the second boundary line includes a convex portion protruding from the non-transistor region toward the first transistor region in a plan view, and
wherein the floating via is formed in the convex portion.

11. The semiconductor device according to claim 1, further comprising a laminated structure in which a plurality of semiconductor chips are laminated,
wherein the first semiconductor chip is a semiconductor device which is a semiconductor chip arranged in a lowermost layer among the plurality of semiconductor chips constituting the laminated structure.

* * * * *